US006414559B1

(12) United States Patent
Cole et al.

(10) Patent No.: US 6,414,559 B1
(45) Date of Patent: Jul. 2, 2002

(54) SINGLE PACKAGE TEMPERATURE COMPENSATED ELECTRONIC DEVICE

(75) Inventors: Douglas Gene Cole, Lewisville; Ranganath Bagade; Titkwan Hui, both of Richardson, all of TX (US)

(73) Assignee: Dallas Semiconductor Corporation, Dallas, TX (US)

( * ) Notice: Subject to any disclaimer, the term of this patent is extended or adjusted under 35 U.S.C. 154(b) by 0 days.

(21) Appl. No.: 09/706,069

(22) Filed: Nov. 3, 2000

Related U.S. Application Data

(63) Continuation of application No. 09/351,996, filed on Jul. 12, 1999, now Pat. No. 6,160,458, which is a continuation-in-part of application No. 09/046,150, filed on Mar. 23, 1998, now Pat. No. 5,994,970.

(51) Int. Cl.[7] ................................................ H03F 1/00
(52) U.S. Cl. ........................................ 331/158; 331/176
(58) Field of Search ................................. 331/158, 176, 331/68, 116 FE, 116 R

(56) References Cited

U.S. PATENT DOCUMENTS

| 5,117,206 A | 5/1992 | Imamura ..................... 331/158 |
| 5,204,975 A | 4/1993 | Shigemori ................... 455/231 |
| 5,500,628 A | 3/1996 | Knecht .......................... 331/68 |
| 5,659,270 A | 8/1997 | Millen et al. ................. 331/69 |
| 5,668,506 A | 9/1997 | Watanabe et al. ............. 331/66 |
| 5,801,594 A | 9/1998 | Muto et al. .................. 331/158 |

Primary Examiner—Robert Pascal
Assistant Examiner—Henry Choe
(74) Attorney, Agent, or Firm—Jenkins & Gilchrist

(57) ABSTRACT

A temperature compensated crystal oscillation circuit adapted to be contained within a small device package and providing an output frequency accuracy of approximately +/−2 ppm over a temperature range or less than 2 minutes per year over the temperature range. The device includes crystal and a single integrated circuit wherein the integrated circuit has a temperature sensing circuit with a digital output, control circuitry, a memory circuit and a switched capacitor array for compensating the oscillation of the crystal oscillator over temperature.

5 Claims, 7 Drawing Sheets

| PKG | 36-Pin Ball Grid Array | |
|---|---|---|
| DIM | MIN | MAX |
| A(in) | | 0.400 |
| B(in) | | 0.450 |
| C(in) | | 0.025 |
| D(in) | | 0.200 |
| E(in) | | 0.350 |
| F(in) | | 0.150 |
| G(in) | | 0.025 |

SINGLE PACKAGE TEMPERATURE COMPENSATED ELECTRONIC DEVICE

RELATED APPLICATIONS

This application is a continuation of U.S. patent application Ser. No. 09/351,996 filed on Jul. 12, 1999, now U.S. Pat. No. 6,160,458, which was a continuation-in-part of U.S. patent application Ser. No. 09/046,150 filed on Mar. 23, 1998 (now U.S. Pat. No. 5,994,970).

BACKGROUND OF THE INVENTION

1. Field of the Invention

The present invention relates to a temperature compensated crystal oscillator circuit. More particularly the present invention relates to a temperature compensated crystal oscillator circuit that utilizes switched capacitor technology wherein all circuitry is contained in a single electronic package, does not need to be calibrated after it leaves manufacturing, and that provides an oscillation frequency with little variation over a wide temperature range.

2. Description of the Related Art

Keeping track of time electronically is an important function. Real time clock circuits have become more and more important in the electronic design industry. Portable computers, portable phones, portable global positioning devices, and many other electronic devices which require accurate real time clock circuits are being used in a wide variety of environments. The electronic devices are required to operate in a cold environment one day and then the next day the same electronic device will be used in a warm environment.

It is well known that temperature has an effect on real time clock circuitry. More particularly as temperature changes the frequency of an oscillation circuit also changes. A crystal, for example a tuning fork style crystal, oscillates at a higher frequency in a midrange temperature and at a lower frequency in cold and a hot temperatures. An AT-cut style crystal will oscillate at a lower frequency in a warm temperature than in a cold temperature. Designs for a real time clock or any oscillation circuits have allowed for speeding up and slowing down of an oscillator in high and low temperatures with a belief that the circuit will spend most of its time in moderate temperatures where the variance in oscillation frequency rate is small. It was also thought that over the course of a year the circuit may spend about the same amount of time in a cold environment as a hot environment thereby nearly balancing the temperature related increase and decrease in oscillation speed.

Compensation circuits used in conjunction with oscillation circuits speed up or slow down the oscillation circuit so that oscillation output is at more of a steady frequency over a wider temperature range. In the past, thermistor and analog temperature sensing devices were used to sense temperature changes.

There are many drawbacks and pitfalls in the electronic designs of former temperature compensated oscillators. First since an analog temperature sensing device is a non-linear device, it was difficult to calibrate the compensation circuitry, especially in mass produced devices. Second, the temperature sensing was not done in the same location as the crystal oscillator was located on the circuit board. There are many temperature gradients around circuitry operating on a printed circuit board. Components on the printed circuit board operate at different temperatures thereby creating temperature gradients. When a temperature sensor is not physically and substantially a part of the oscillation circuitry, the sensor may be sensing a temperature gradient from a neighboring part and not the temperature of the crystal oscillator. Thus, the result of the former temperature compensation circuits is an inaccurate oscillation frequency output. The result of products incorporating the prior temperature compensating circuitry wherein the temperature sensor was not physically part of the compensation and oscillation circuits required the finished products to have the oscillation circuits calibrated after the product was finished being manufactured.

Thirdly, previous crystal oscillators that have been temperature compensated still have a substantial output frequency deviation over the specified temperature range. Previous compensated devices have had frequency deviations over a temperature range of 0° to 40° C. of more than 20 ppm or more than 10 minutes per year. These deviations have become unacceptable in many areas of electronic design such as portable computers, cell phones and medical equipment.

There is a need for a temperature compensated oscillation circuit that maintains better accuracy than prior compensated circuits over a defined temperature range; that incorporates accurate temperature sensing of the area about the crystal oscillator; that is provided in a single electronic package; that is less expensive to manufacture and sell than prior circuitry for compensating a crystal oscillator over temperature; and that is pre-calibrated so that it can be installed in an electronic device without being re-calibrated to the environment within the device.

SUMMARY OF THE INVENTION

Exemplary embodiments of the present invention solve the inadequacies of the prior designs for temperature compensated crystal oscillator circuits by providing a temperature compensated crystal oscillator in a single package.

An object of the present invention is to provide a temperature compensated crystal oscillator (or other type of oscillator circuit) with output frequency that deviates less than +/−2 ppm over a temperature range of 0 to 40 C.

Another object of the present invention is to provide a temperature compensated crystal oscillator with an output frequency that deviates less then approximately +/−7.5 ppm over a temperature range of −40 C. to 85 C.

Another object of the present invention is to provide a temperature compensated oscillator that deviates from a predetermined output frequency by less than 2 minutes per year within a predetermined temperature range.

These and other objects, which will become more apparent from a review of the FIGURES along with the Detailed Description, are achieved in an exemplary embodiment of the present invention by providing a single small electronic component package comprising a crystal oscillator compensated by a switched capacitor array. The switched capacitor array is controlled by a digital temperature sensing circuit which operates in conjunction with a decode circuit. This exemplary single package device operates via a VCC power supply and can be battery backed in case of a VCC power failure. The resulting frequency output is preferably a 32.768 KHz output that deviates less than 2 minutes per year if operated within 0 to 40 C.

BRIEF DESCRIPTION OF THE DRAWINGS

Other objects, advantages, and novel features of the present invention can be understood and appreciated by reference to the following detailed description of the invention, taken in conjunction with the accompanying drawings in which.

DETAILED DESCRIPTION OF THE PREFERRED EXEMPLARY EMBODIMENTS OF THE PRESENT INVENTION

Figure 1:
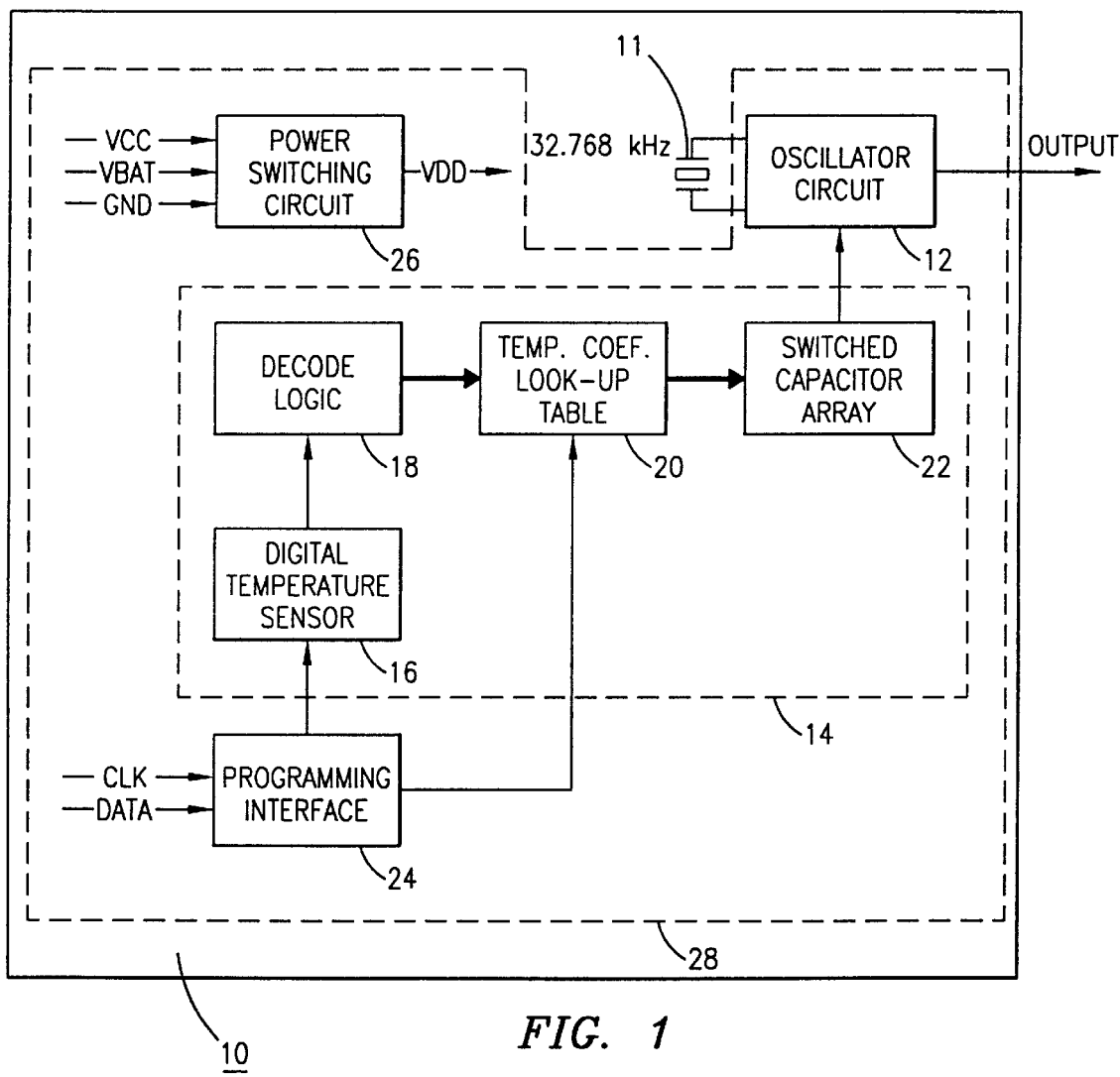
FIG. 1 depicts a block diagram of a first exemplary embodiment of the present temperature compensated oscillation circuit.

Referring now to the drawings wherein elements are designated with reference numerals throughout the several views, and wherein the various elements depicted are not necessarily drawn to scale, and, in particular, to FIG. 1 wherein a block diagram of an exemplary embodiment of the present temperature compensated crystal oscillator circuit 10 is depicted. In a preferred embodiment a 32.768 KHz crystal 11 is connected to a oscillation circuit 12. The oscillation circuit provides a compensated 32.768 KHz output frequency. The output frequency is compensated by the compensation circuitry. The output frequency of an exemplary temperature compensated crystal oscillator deviates less than +/−7.5 parts-per-million (ppm) over a temperature range of −40 to 85 C. More specifically, the frequency output of a preferred temperature compensated crystal oscillator is +/−2 ppm over a temperature range of 0 to 40 C.

The compensation circuitry 14 is connected to the oscillator circuitry in order to vary a capacitance load on the crystal. The variance in capacitance speeds up or slows down the oscillation circuitry. Thus, the compensation circuitry acts as a means for compensating the oscillator circuitry. Within the compensation circuitry 14 are a variety of other circuits. A temperature sensor 16 is provided to sense the temperature of the platform and/or area immediately surrounding the crystal 11. The temperature sensor should provide a digital output to other circuits within the compensation circuitry. The digital output should have a resolution of at least 9 bits, but may incorporate a higher resolution if necessary (such as 12 or 14 bits). If temperature compensation is required over a wider range of temperatures then more resolution may be necessary.

The digital temperature sensor 16 provides its digital temperature output to a decode logic circuit 18. The decode logic circuit 18 decodes the digital temperature. The decode logic circuit provides the decoded signal to the look-up table 20. The look-up table is preferably an EPROM circuit, but could be a ROM or PROM or other memory circuit that maintains memory and can be used as a look-up table. The look-up table 20 provides the appropriate temperature coefficient to the switched capacitor array 22. In other words, the look-up table 20 drives the switched capacitor array 22 to adjust the capacitive load on the oscillator circuit 11, 12. The result being an accurate 32.768 kHz output for use in applications requiring, among other things, real time clock circuitry.

Still referring to FIG. 1, there is depicted a programming interface circuit 24. The programming interface 24, in an exemplary embodiment; is used during manufacturing of the exemplary temperature compensated crystal oscillator 10. The programming interface is used to calibrate the crystal's characteristics when the component is being tested and programmed. During manufacturing the component is placed in a temperature controlled environment and subjected to several discrete temperatures. The programming interface is used to switch the capacitive load and determine the correct capacitive load for each discrete temperature to thereby maintain a steady, accurate frequency output at the various temperatures. Once the correct capacitive load values are determined for each discrete temperature, the values are interpolated or curve-fitted for temperatures in between the discrete temperatures. A table is generated for the full temperature range of the exemplary temperature compensated crystal oscillator 10. The table is then stored in the look-up table EPROM 20.

The programming interface 24 connects and communicates with test/programming equipment via a clock and a data connection. Programming of an exemplary embodiment is discussed in more detail below.

Still referring to FIG. 1, a power switching circuit 26 is provided. The power switching circuit provides VDD to the other circuits in the exemplary temperature compensated crystal oscillator 10. Power to the power switching circuit 26 is provided via VCC or VBAT. When both a VCC and a VBAT source are connected to the cower switching circuit 26, then VBAT will be used if VCC drops below VBAT. That is, VCC should be between about 4.5 and 5.5 volts. VBAT should provide power at between approximately 2.7 and 3.7 volts. If only one source is being used, then the single source is preferably connected to VCC and VBAT is grounded. In the case of a single source, the VCC range should be approximately 4.5 to 5.5 volts or 3.0 to 3.6 volts. The nominal operating voltage (3 or 5 volts) can be selected via a laser fuse. The power switch circuit 26 switches the internal power supply VDD from VCC to VBAT when VCC falls below VBAT. Also the power switch circuit 26 switches from VBAT to VCC when VCC rises above VBAT by at least 0.3 volts.

Furthermore, an exemplary power switch 26 can also provide a signal to indicate the source/voltage range of the power supply (i.e.,. VCC is 5 or 3 volt nominal and/or VBAT or VCC is providing power). This signal can be used by the decode logic block 18 to generate an address for 3 volt or 5 volt sections of the EPROM look-up table 20.

Figure 2:
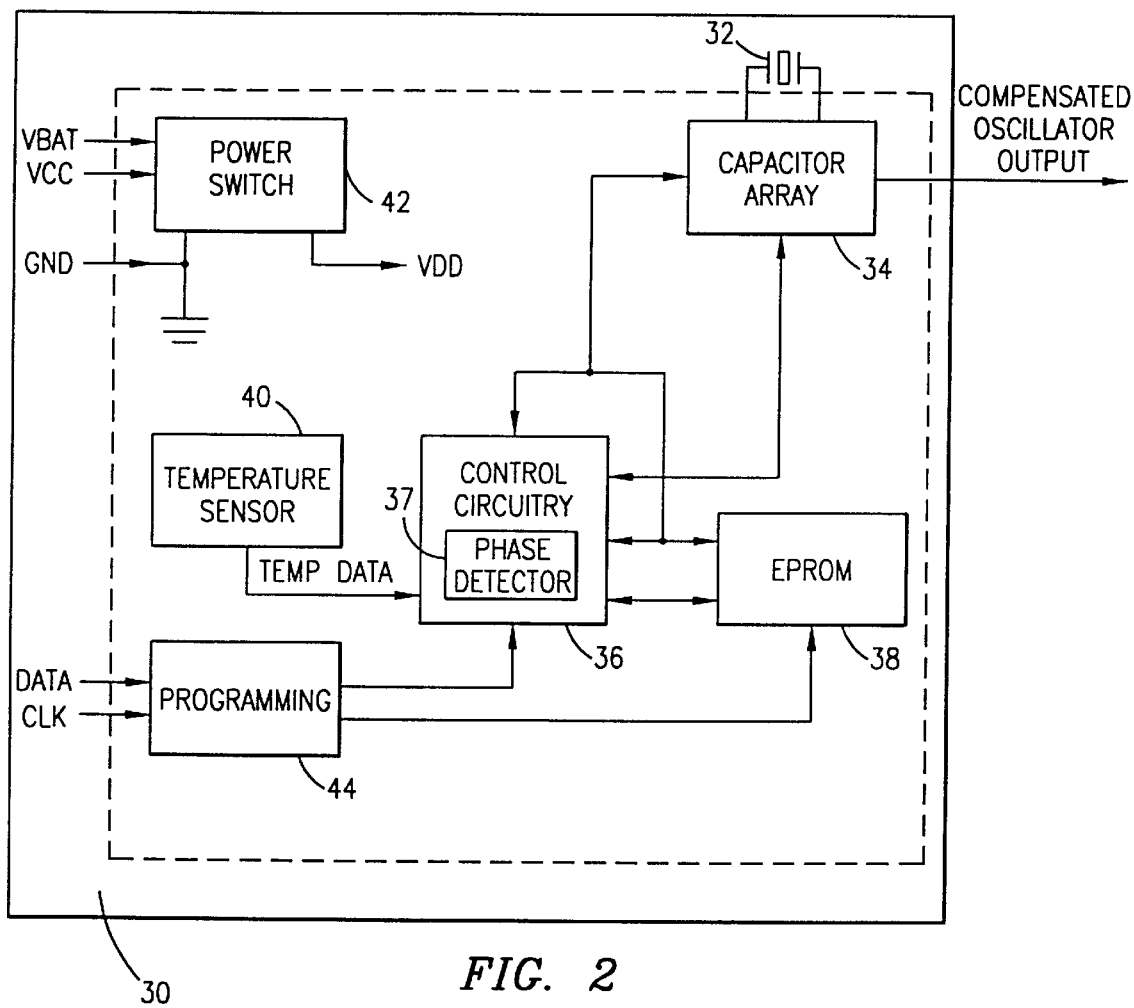
FIG. 2 depicts a block diagram of a second exemplary embodiment of the present temperature compensated oscillation circuit.

Referring now to FIG. 2, a second exemplary embodiment of the present temperature compensated crystal oscillator 30 is shown. A crystal oscillator 32 is connected to a switched capacitor array 34. A capacitive load is switched to load the crystal and thereby compensate the "compensated oscillator output" signal. A temperature sensor 40, an EPROM 38, and a control circuit 36, work in conjunction to select the correct capacitive load for the crystal 32 based on the temperature of the device.

The temperature sensor 40 preferably provides a digital output to the control circuit 36. The temperature sensor 40 is preferably a digital temperature sensor which provides a 10-bit digital output. The temperature sensor preferably measures temperature by counting the number of clock cycles that an oscillator with a low temperature coefficient goes through during a gate period determined by a high temperature coefficient oscillator. The counter within the temperature circuit, for example, is preset with a base count that corresponds to −55 C. If a counter reaches zero before a gate period is over a temperature register, which is also preset to the −55 C. value, is incremented indicating that the temperature is higher than −55 C. At the same time, the counter is then reset with a value determined by a slope of an accumulator's circuitry. The counter is then clocked again until it reaches zero. If the gate period is still not finished, then the process repeats. In a preferred embodiment of the present invention the digital temperature sensing circuit would be similar to the DS1721 manufactured by Dallas Semiconductor.

It is understood that the temperature sensor 40 could be designed using a variety of designs. At a bare minimum, the temperature should have a digital output which provides enough resolution over the required temperature range of the temperature compensated oscillator 30 to be able to switch the capacitor array and provide enough accuracy for the compensated oscillation output. Varistors, thermistors, diodes, transistors, ring-oscillators, oscillation circuits or other comparable circuits could be used to sense temperature and be incorporated into the present temperature compensated crystal oscillator 30 without deviating from the spirit of the present invention. Furthermore, more or less than 10-bits of temperature data may be successfully used in the present invention without deviating from the spirit of the invention.

Still referring to FIG. 2, the EPROM 38 is preferably a design using a double poly 0.8 um process. It may consist of three sections for data: a 5 volt data section, a 3 volt data section, and a calibration section. Other sections may be added if needed. In the preferred device the EPROM 38 uses 10-bit words. All of the three sections are contained in the same EPROM array, but the distinctions between the sections are made via the addresses and controls used for accessing each section. The data sections will contain data for switching functions in the capacitor array 34 to compensate for the variations in temperature or operating voltage. The calibration section of the EPROM 38 will contain calibration data and a calculated T0 value for the crystal.

In an exemplary embodiment of the present invention the calibration data for a temperature may consist of the following:

word 1: temperature;
word 2: delta (Δ) frequency, v(defined as deviation from nominal frequency of 32.768 KHz represented as 2's complement binary number);
word 3,4: trim code for 5 volt and 3 volt operation; and
word 5–8: Δf1 and Δf2 for 5 volt, Δf1 and Δf2 for 3 volt. Note that T0 is a the turn-over temperature for a tuning fork style crystal oscillator; and that Δf1 and Δf2 represent a frequency deviation from the nominal 32.768 KHz frequency (for variation in the lsb of the trim code).

The T0 value can be stored in the EPROM 38 and will be loaded into its respective register in the interface block immediately after a power on reset function. T0 is determined during a curve fitting part of the calibration routine, discussed below. T0 is used in conjunction with the temperature read from the temperature sensor 40 to access the correct calibration word in the EPROM 38 during normal operation of the exemplary temperature compensated crystal oscillator 30. The EPROM array 38 may consist of, for example, 64 rows by 72 columns. The array can be subdivided as follows:

| | |
|---|---|
| address: 000H-07FH | 5 volt data |
| address: 080H-0FFH | 3 volt data |
| address: 100H-14FH | Calibration Data |
| address: 1FEH-1FFH | T0/T0 offset |

Due to the slow speed requirements of the EPROM 38 there may not be a need for a diff-sense amplifier. Data sent out of the EPROM 38 should be sent via a register. The register can serve as the holding register for the capacitor array 34.

The control circuitry 36 contains all the state machines and logic necessary to interface with the other circuits on the integrated circuit. The main functions of the control circuitry 36 are handshaking with the temperature sensor circuit 40, interfacing with the EPROM 38, calibration/programming control, and oscillator and clock control.

The temperature sensor circuit 40 is responsible for initiating temperature measurement and for providing the temperature to the control circuitry 36. Then the control circuitry 36 retrieves the temperature data from the temperature circuitry 40. Once the temperature data is retrieved from the temperature circuitry 40, the control circuitry 36 instructs the EPROM 38 to provide the correct data to the control circuitry 36 or the capacitor array 34, such that the proper capacitance for the temperature is switched to load the crystal oscillator 32 and thereby compensate the frequency output.

In the exemplary embodiment, the capacitor array 34 is switched at the lowest voltage of the oscillation cycle. Because at the low voltage point of the oscillation cycle the capacitor array 34 looks almost like a discharged capacitor, switching the capacitor array 34 at the low voltage point allows for a reduction in power consumption and for a compensation for voltage variations associated with battery backed operations. Furthermore, by switching the capacitor array 34 at the low point in the oscillation cycle, the voltage across the capacitor array 34 is essentially zero—thereby limiting any discharge from the capacitor array 34 or drain to the oscillation cycle during switching of the capacitor array 34. Additionally, switching the capacitor array 34 at a low or zero point in the oscillation cycle limits the amount of noise in the clock output.

To switch the capacitor array 34 at the low voltage point, the exemplary embodiment utilizes delay line techniques to determine the one-quarter and three-quarter points of the clock signal from the crystal oscillator 32. For example, the clock signal is propagated through identical cascaded delay stages (not shown). The period of the incoming cycle is determined in the "count phase" by the stage N of the line that has been reached in one clock cycle. In the "update phase" the capacitor array 34 is switched when the clock signal reaches the N/4 and 3N/4 stage.

Figure 2A:
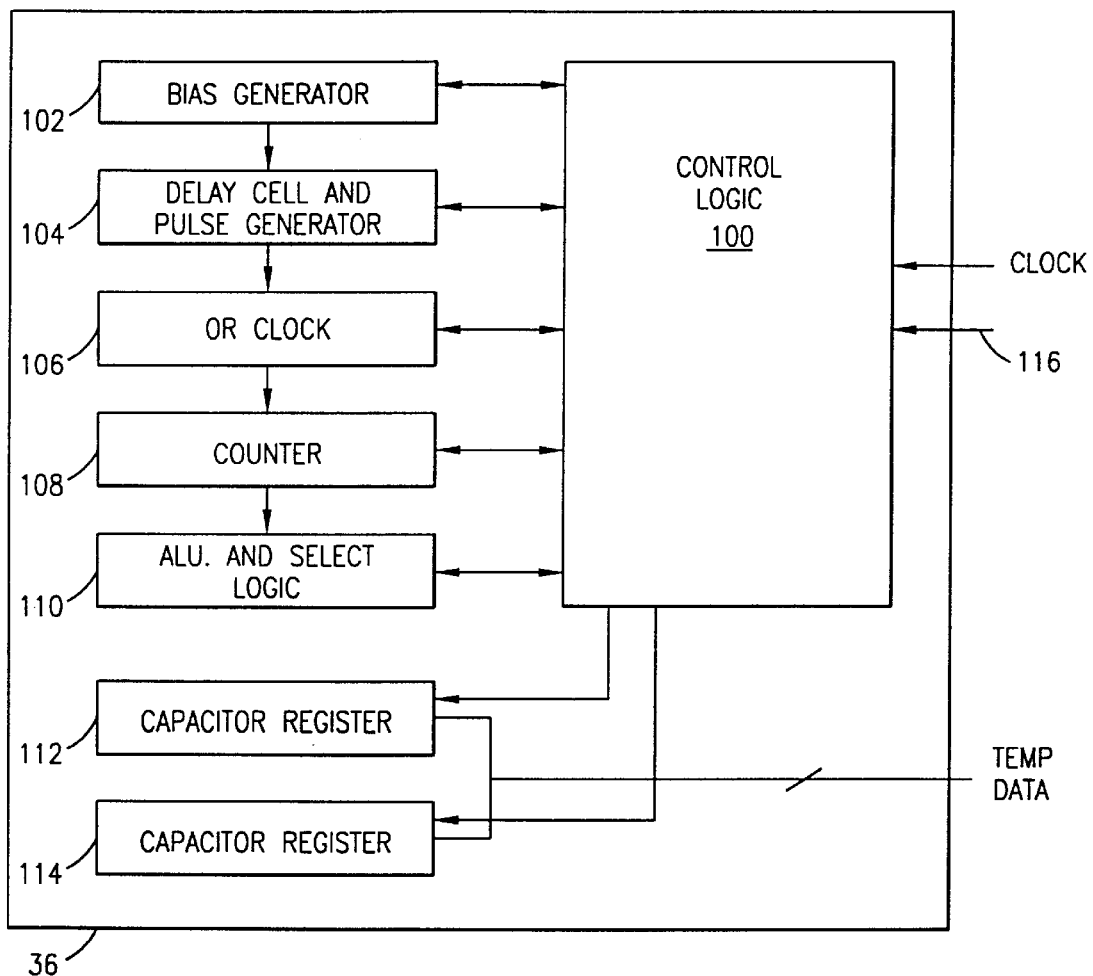
FIG. 2a depicts a more detailed diagram of the control circuitry illustrated in FIG. 2.

Referring now to FIG. 2*a*, there is illustrated a more detailed diagram of the control circuitry 36 shown in FIG. 2. In the exemplary embodiment, the control circuitry 36 is responsible for determining the low voltage points and controlling the capacitor array 34 accordingly. One skilled in the art can easily understand that the functionality of the different components of the control circuitry 36 can be implemented in various fashions and that only an exemplary embodiment is described.

Control circuitry 36 includes a control logic 100 connected to each of a bias generator 102, a delay cell and pulse generator 104, an OR block 106, a counter 108, an arithmetic logic unit (ALU) and select logic 110, a capacitor register 112, and a capacitor register 114.

The bias generator 102 provides a bias voltage for the delay cell and pulse generator 104. In the exemplary embodiment, the bias generator has provisions to compensate for voltage variations associated with battery-backed mode.

The delay cell and pulse generator 104 includes a delay cell (not shown), a one-shot circuit (not shown) and a tristatable output (not shown). The one-shot circuit produces a narrow pulse at the falling edge of a transition for each of its associated delay stages. These pulses are ORed together in the OR block 10 and the output of the OR block 106 is used as the count pulses signal for counter 108.

The ALU and select logic 110 is used to determine the N/4 and 3N/4 stage and select the appropriate stage output when updating the capacitor array 34. The ALU and select logic 110 also has logic to facilitate the testing of the delay elements and associated logic. Furthermore, the counter 108 is always cleared on the rising edge transition of a load capacitance array signal which is received at control logic 100 on line 116.

A power switch circuit 42 is provided to allow an exemplary device to operate on one of two sources of power, VCC or VBAT. VCC preferably has a voltage range of 4.5 to 5.5 volts. VBAT preferably has a voltage range of 2.7 to 3.7 volts. If only one source is being used, then the single source should be connected to VCC and VBAT should be grounded. In an exemplary device the single VCC source can be either 4.5 to 5.5 volts or 3.0 to 3.6 volts. A laser fuse can be incorporated into the present invention to indicate whether the nominal operating voltage is 3 or 5 volts.

The power switch circuitry 42 provides VDD to the various circuits in an exemplary device. The power switch circuitry 42 will switch between VCC and VBAT based on the following preferred criteria. The power switch circuitry 42 will switch from VCC to VBAT when VCC falls below VBAT. The power switch circuitry 42 will switch from VBAT to VCC when VCC rises above VBAT by at least 0.3 volts. The 0.3 volt hysteresis is provided in this switching algorithm to prevent excessive switching between VBAT and VCC.

The power switch circuitry 42 also may generate a source/voltage range of the power supply signal. That is, a signal will indicate whether VDD is nominally 5 or 3 volts so that the correct data can be extracted from the EPROM.

A programming circuit 44 may also be included in an exemplary temperature compensated crystal oscillator 30. The programming circuit would preferably connect via a two wire connection to data and clock. The technique for programming an exemplary embodiment will be described below.

Figure 3:
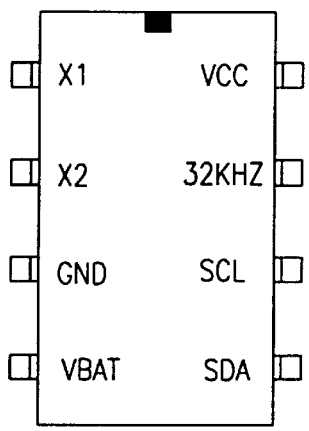
FIG. 3 depicts an exemplary silicon chip with eight pad sites for connecting the circuitry found within the integrated circuit to other circuitry.

The circuitry of the exemplary embodiment of a temperature compensated crystal oscillator is found, with the exception of the crystal itself, on a single integrated circuit. FIG. 3 depicts an exemplary depiction of a silicon chip with eight pad sites for connecting to the circuitry found within the integrated circuit. GND is the ground connection. X1 and X2 are used for connection to the crystal. VCC is for connecting to a power source. VBAT is for connecting to a secondary power source such as battery. SCL and SDA are used when the exemplary device is being programed and calibrated. SCL is a clock signal and SDA is the data line. 32 KHZ is the output connection location. In an exemplary device, the output is a temperature compensated 32 KHz clock. It is understood that the present exemplary embodiment could be designed to temperature compensate crystal oscillation over a wide range of frequencies. The frequencies could range from close to zero Hz up to about 100 megahertz. As long as the proper compensating capacitances are available in the switched capacitor array and so long as the digital temperature sensor provides enough resolution over the working compensated temperature range, then designs very similar to the disclosed exemplary embodiments could be used without departing from the spirit of the presently disclosed design.

Furthermore, in an exemplary embodiment of the present invention the dimensions of the actual silicon chip is approximately 80 mils×145 mils. The size of the silicon chip allows the present exemplary embodiment to provide a small module package size that can be used in electronic circuitry designs having limited space requirements.

Figure 4:
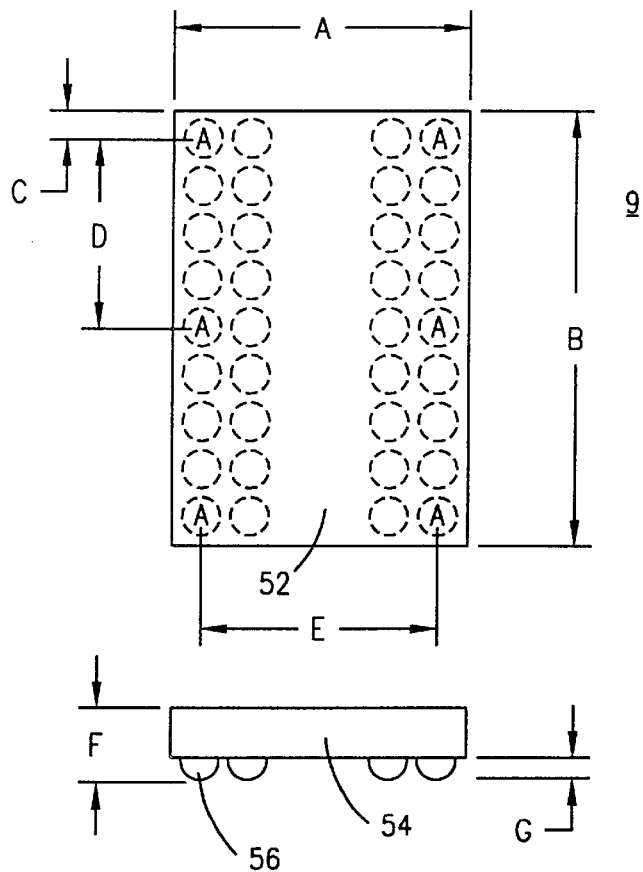
FIG. 4 depicts the size and shape characteristics of a preferred package for a present exemplary device.

The integrated circuit of FIG. 3 is combined with a crystal and then tested and programmed over the required temperature range via the data and clock connections. Once the part has been programmed and tested, it is packaged in a six active pin package as shown in FIG. 4. Exemplary active pins are marked with an "A". For mechanical stability or other manufacturing reasons, the number of pins/connections can increase to meet required specifications. At present, the exemplary embodiment has 36 pins/connections (only 6 pins being active) and utilizes ball grid technology in order to minimize the amount of space used by the exemplary package and simplify manufacturing and mounting of the exemplary package on a circuit board. The top view 52 of the package indicates that the length and width dimensions of an exemplary device is 0.4 in by 0.45 in. The side view of the exemplary device indicates that the height of the device is about 0.15 in. The exemplary package covers about 0.18 square inches of circuit board space. This is a significant advantage over prior temperature compensated circuits which require the crystal oscillator to be mounted directly onto a circuit board along with various other compensation circuits being mounted near and about to the crystal. The, space requirement of prior circuits is much larger than that required by the present exemplary embodiments. Furthermore, the present temperature compensated crystal oscillator does not need to be packaged, but instead could consist of the crystal and the single integrated circuit (unpackaged) in order to substantially decrease the space requirement for the temperature compensated clock/oscillation circuit.

Although FIG. 4 indicates that the package has 36 pins, only 4 of the pins are required for operation. The 4 pins are VBAT, VCC, GND and 32 KHZ output pin. The extra solder bumps need not be present or could be used for extra support when attaching the device to a circuit card.

Solder bumps 56 (which utilize ball grid technology) or other known means for connecting the exemplary package to a circuit board or other electronic circuitry can be used. It is understood that the present invention can be placed within a plethora of electronic package schemes, such as a can style package, or various integrated circuit style packages.

Figure 5:
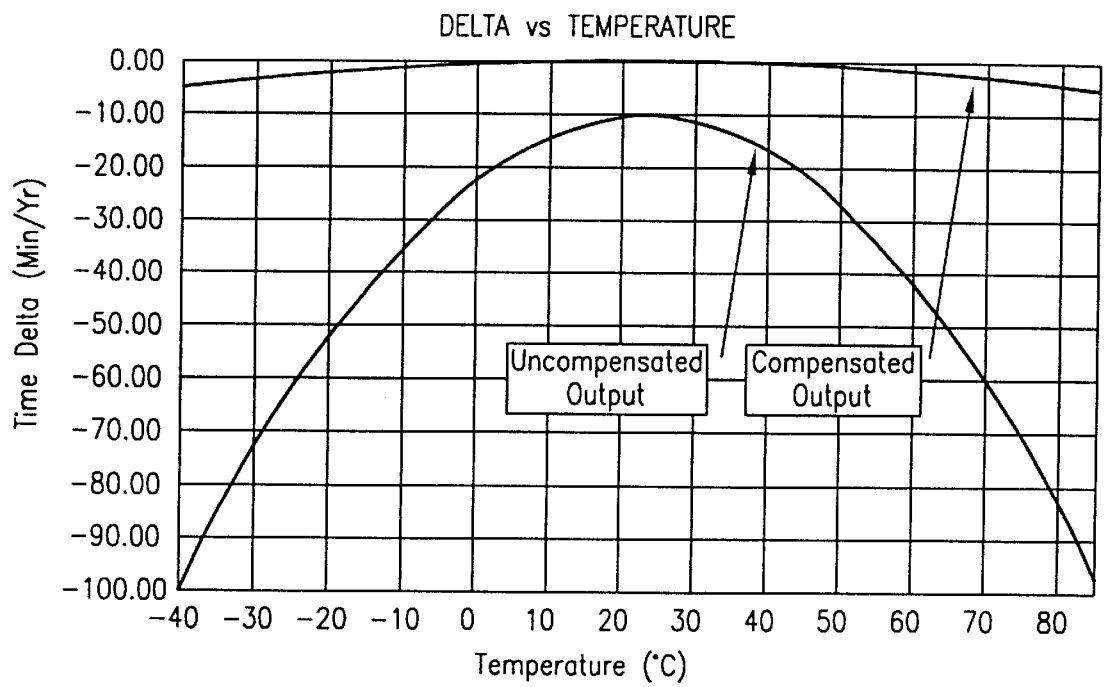
FIG. 5 depicts a graph of the output of an exemplary temperature compensated oscillation circuit and a non-compensated oscillation circuit in a change in time v. temperature graph.
Figure 6:
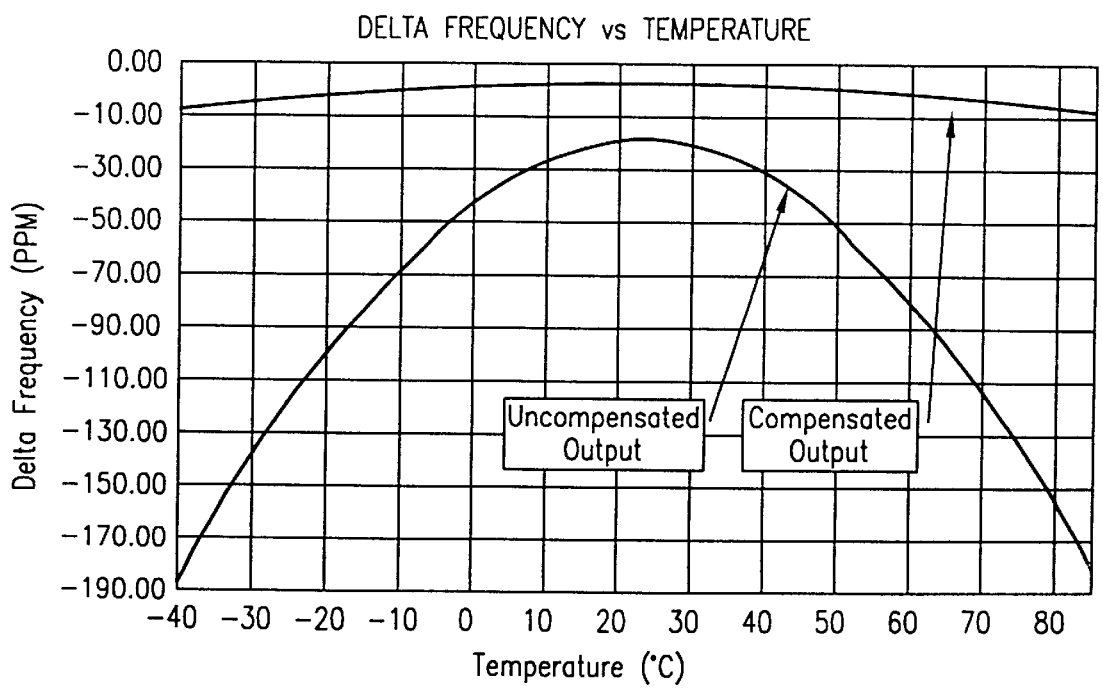
FIG. 6 depicts a graph of the output of an exemplary temperature compensated oscillation circuit and a non-compensated oscillation circuit in a change in frequency v. temperature graph.

In essence, a present exemplary embodiment of a temperature compensated oscillator combined with a crystal provides a solution to providing a temperature compensated crystal oscillator that would require a minimum of circuit board space and that also provides a high degree of timing accuracy over a large temperature range. In a preferred exemplary embodiment, the accuracy for a 32.768 KHz device is at least +/−7.5 parts per million, or better, over the temperature range of −40 C. to 85 C. or equal to or less than a +/−4 minutes per year timing error. FIGS. 5 and 6 each depict an uncompensated crystal oscillator curve and a temperature compensated output in accordance with the presently described exemplary embodiments.

Figure 7:
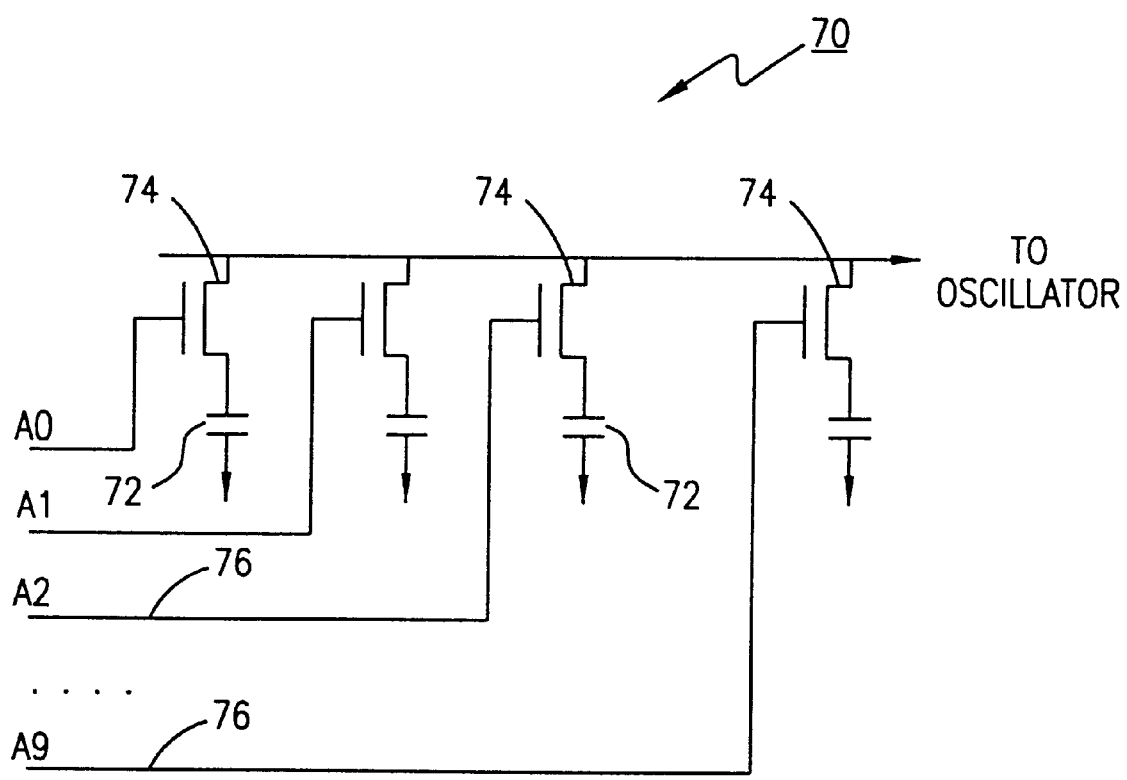
FIG. 7 depicts an exemplary portion of a charged capacitor array adapted for use in an exemplary embodiment of the present temperature compensated oscillation circuit.

Referring to FIG. 7, a portion of the switched capacitor array 70 is shown. Capacitors 7.2 are switched to be active or inactive in the circuit via the switching transistors 74. Data lines 76 are used to switch the switching transistors 74 on and off. The data lines 76 receive the data from the EPROM or look-up table. It is important to note that in a preferred embodiment the capacitors are switched at the lowest voltage of the oscillation cycle. At the low point (or zero point) the capacitor looks almost like a discharged capacitor. By switching the capacitor at a low point in the oscillation cycle, the voltage across the capacitor is essentially zero thereby limiting any discharge from the capacitor or drain to the oscillation signal during the switch of capacitance. Switching the capacitors at a low or zero voltage point in the oscillation sinusoid will limit the amount of noise in the oscillation or clock output.

Referring now to FIGS. 1 and 2, the programming interface 24, 44 is used to calibrate the crystal 11, 32 characteristics during the test portion of the manufacturing process. For example, the part is cycled through 5 discrete temperatures. While at each temperature the output frequency of the device is tested and at the same time the correct capacitance for compensating the output frequency is determined. The programming interface switches the capacitor array until the output is correct. From the five collected data/temperature points an interpolation or curve-fitting calculation is made and the appropriate capacitance switching data is stored in the EPROM. Once the part has been calibrated, there is no need for using the programming portion of the circuitry again. Thus, it is understood that the programming circuitry may not be required on the integrated circuit in exemplary devices.

Figure 8:
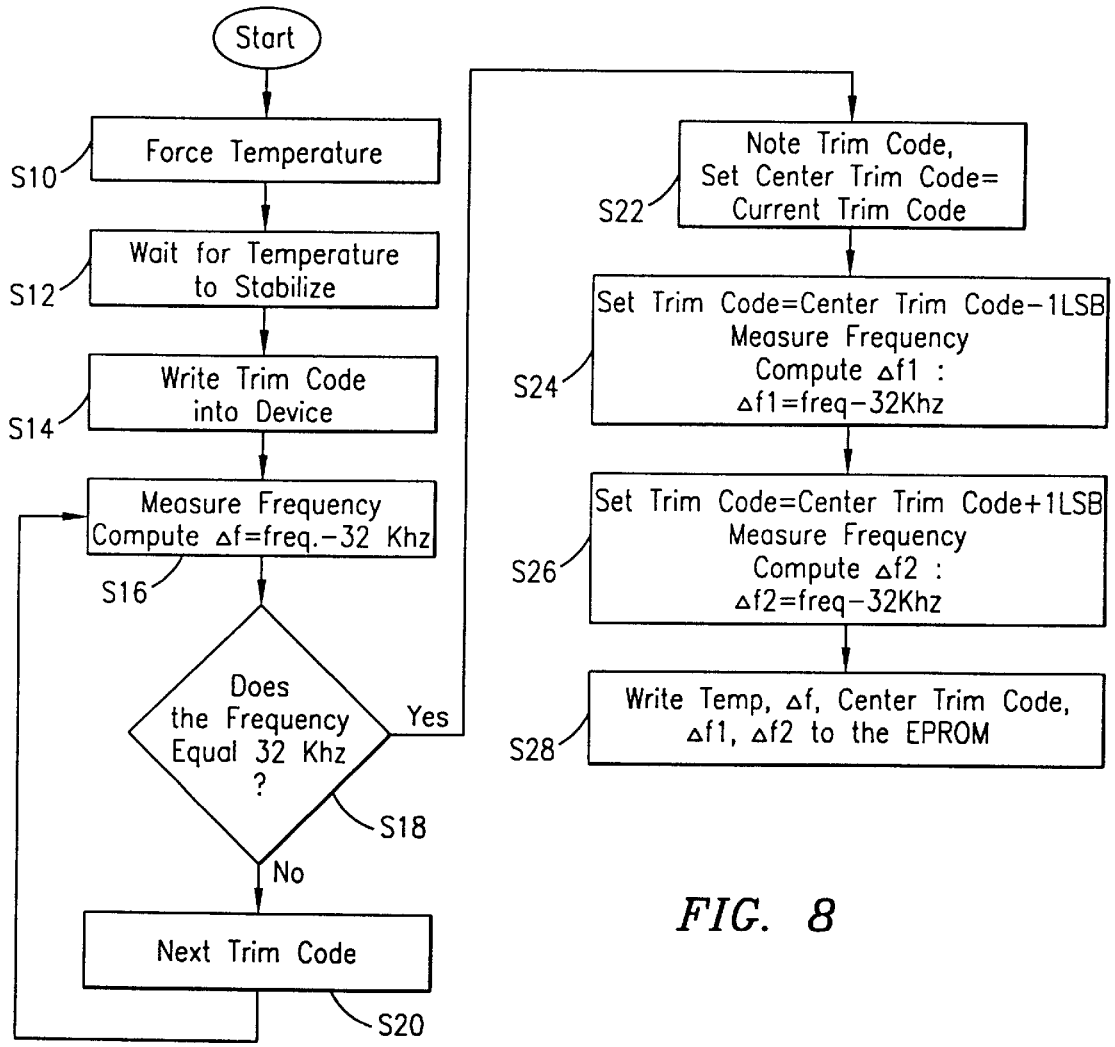
FIG. 8 depicts a flow chart describing an exemplary frequency calibration technique.

FIG. 8 depicts a flow chart indicating the programming and calibration method for an exemplary embodiment of the present temperature compensated crystal oscillation circuit. Correct calibration of the exemplary temperature compensated crystal oscillator is one of the keys to its accuracy. There are two types of calibration that must occur: 1) temperature calibration, and 2) frequency calibration over temperature.

Temperature calibration is for calibrating the temperature sensing circuitry. Temperature calibration can be done during the probing step of integrated circuit manufacturing. Basically, the wafer, is placed onto a chuck and the temperature of the die is recorded. In addition, a thermocouple is connected to the temperature read from the integrated circuit. A "blanket" trim code is determined for the wafer. The wafers are then sent to laser wherein the trim codes are set. Automation of this procedure provides for the greatest accuracy.

Frequency calibration is described, in part, in FIG. 8. In an exemplary embodiment five temperature calibration points are required for the desired oscillator to be accurate over temperature. This number of temperature test points may increase or decrease depending on marketing demands, temperature range demands, or demands for higher output linearity.

In this calibration example, it is assumed that the exemplary device is to be compensated over temperature to 32.768 KHz. In Step S10 the device is forced to one of the predetermined temperatures. For each predetermined temperature, the temperature stability of the test chamber is very important. The temperature should not vary more than 0.25 degrees C. over 1 second. The exact temperature in the test chamber is not nearly as important as the stability over the calibration time. Once the temperature stabilizes, Step S12, then the trim code is written to the device, Step S14. In Step S16 the output frequency of the device, at the test temperature is recorded and delta f1 is computed as the difference between the output frequency and 32 KHz. A decision is made as to whether the output frequency is equal to 32 KHz, Step S18. If the output frequency is not equal to 32 KHz then the next trim code is loaded into the device thereby switching the capacitance loading the crystal oscillator, Step S20. Steps S18 and S20 are repeated until the output frequency is equal to 32 KHz. In Step 22, the trim code that produced the correct output frequency at the test temperature is set to be the center trim code. In Steps S24 and S26 delta f1 and delta f2 are determined by applying the trim code that is one least significant bit above and below the center trim code and calculating the difference between the output frequency and 32 KHz. Once Step S26 is completed then the test temperature, delta f, the center trim code, delta f1, and delta f2 are written to the EPROM/lockup table. This process is performed for each test temperature and for each operating voltage of the device both 3 and 5 volts.

In order to perform the calibration and test of the exemplary device, the test equipment and/or hardware used should be able to measure the output frequency to within +/−0.5 ppm accuracy. There are several techniques to provide this level of accuracy (large sampling period, internal measurement equipment, etc); whatever method is chosen should have a calibration procedure in place to verify and assure that the reference oscillator used does not drift over time. Preferably the test equipment should be able to also read and store the measured frequency, as well as perform some basic number crunching functions.

Once the five temperatures are tested and the calibration Steps S10 through S28 are performed for both 3 and 5 volts, then interpolation or best-fitting calculations are performed to determine the appropriate trim codes for the temperatures between the five temperature test points. This trim point data is then stored in appropriate memory locations of the EPROM/look-up table in the exemplary device.

The present exemplary embodiments provide a vast improvement over what is presently available to electronic design engineers who require temperature compensated crystal oscillation circuitry in their designs. The present exemplary embodiment is a single integrated circuit and crystal positioned in a single small and compact electronic device package that provides a temperature compensated oscillation frequency or clock signal that varies less than +/−7.5 ppm over a temperature range of −40 C. to 85 C. Note that in an exemplary embodiment of the present invention the crystal is a 32.768 KHz tuning fork style crystal with less than a +/−50 ppm frequency variance at T0. The present exemplary embodiments minimize the space required on a printed circuit board or other electronic circuit for temperature compensation circuitry. Furthermore, in the present exemplary embodiments the crystal and the temperature sensing circuitry are both part of the same package thereby making the sensing of the actual temperature of the crystal very accurate. The present exemplary devices are calibrated during the manufacturing process and therefor do not need to be recalibrated when installed into an electronic device.

Obviously, numerous modifications and variations are possible in view of the teachings above. Accordingly, the present invention is not limited by the embodiments disclosed, but is capable of numerous rearrangements, modifications, and substitutions, without departing from the spirit and scope of the invention as set forth and defined by the following claims.

What is claimed is:

1. A temperature compensated circuit comprising:

an electronic package having external electrical connections;

an integrated circuit, said integrated circuit comprising:

a circuit to be temperature compensated;

a switched capacitor array connected to said circuit to be temperature compensated, said switched capacitor array for switching a capacitive load of said circuit to be temperature compensated;

a memory circuit for storing data related to the switching of said switched capacitor array;

a control circuit connected to said memory circuit and to said switched capacitor array; and a direct to digital temperature sensing circuit for sensing a temperature about said circuit to be temperature compensated and for providing a digital temperature signal to said control circuitry, and wherein said circuit to be temperature compensated being inside a single electronic package.

2. The temperature compensated circuit of claim 1, wherein said single electronic package utilizes ball grid array technology.

3. A temperature compensated circuit of claim 1 wherein said circuit to be temperature compensated comprises:

an oscillator.

4. A temperature compensated circuit as in claim 3 wherein said oscillator comprises:

a crystal oscillator.

5. A temperature compensated circuit as in claim 1 wherein said direct to digital temperature sensing circuit comprises:

a counting circuit for counting clock cycles of an oscillator with a low temperature coefficient during a gate period determined by an oscillator having a high temperature coefficient.

* * * * *

UNITED STATES PATENT AND TRADEMARK OFFICE
CERTIFICATE OF CORRECTION

PATENT NO. : 6,414,559 B1
DATED : July 2, 2003
INVENTOR(S) : Douglas Gene Cole et al.

It is certified that error appears in the above-identified patent and that said Letters Patent is hereby corrected as shown below:

<u>Title page,</u>
Item [74], *Attorney, Agent or Firm*, replace "Jenkins" with -- Jenkens --

<u>Column 2,</u>
Line 45, replace "-40 C. to 85 C." with -- 40 C to 85 C. --

<u>Column 4,</u>
Line 17, replace "embodiment; is used" with -- embodiment, is used --
Line 43, replace "cower" with -- power --

<u>Column 5,</u>
Line 16, replace "-55 C." with -- 55 C --

<u>Column 7,</u>
Line 22, replace "OR block 10" with -- OR block 106 --

<u>Column 8,</u>
Line 47, replace "The, space" with -- The space --

<u>Column 9,</u>
Line 12, replace "Capacitors 7.2" with -- Capacitors 72 --
Line 54, replace "the wafer, is placed" with -- the wafer is placed --

UNITED STATES PATENT AND TRADEMARK OFFICE
CERTIFICATE OF CORRECTION

PATENT NO. : 6,414,559 B1
DATED : July 2, 2003
INVENTOR(S) : Douglas Gene Cole et al.

It is certified that error appears in the above-identified patent and that said Letters Patent is hereby corrected as shown below:

<u>Column 10,</u>
Line 26, replace "EPROM/lockup table." with -- EPROM/lookup table. --
Line 55, replace "-40 C. to 85 C." with -- 40 C to 85 C. --

Signed and Sealed this

Tenth Day of February, 2004

JON W. DUDAS
*Acting Director of the United States Patent and Trademark Office*